(12) United States Patent
Akita et al.

(10) Patent No.: US 9,453,721 B2
(45) Date of Patent: Sep. 27, 2016

(54) CURVATURE MEASUREMENT APPARATUS AND METHOD

(71) Applicant: NuFlare Technology, Inc., Yokohama (JP)

(72) Inventors: Masato Akita, Yokohama (JP); Yasushi Iyechika, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 13 days.

(21) Appl. No.: 14/670,897

(22) Filed: Mar. 27, 2015

(65) Prior Publication Data

US 2015/0276388 A1 Oct. 1, 2015

(30) Foreign Application Priority Data

Mar. 27, 2014 (JP) ................................. 2014-065372
Oct. 28, 2014 (JP) ................................. 2014-218948
Mar. 20, 2015 (JP) ................................. 2015-057144

(51) Int. Cl.
| | |
|---|---|
| G01J 4/00 | (2006.01) |
| G01B 11/24 | (2006.01) |
| G01B 11/255 | (2006.01) |
| G01B 11/16 | (2006.01) |
| H01L 21/67 | (2006.01) |
| H01L 21/66 | (2006.01) |

(52) U.S. Cl.
CPC ............... *G01B 11/24* (2013.01); *G01B 11/16* (2013.01); *G01B 11/255* (2013.01); *H01L 21/67288* (2013.01); *H01L 22/12* (2013.01)

(58) Field of Classification Search
CPC ............... G01N 21/211; G01N 21/21; G01N 2021/213; G01J 4/00; G01B 11/0641
USPC ......................................................... 356/369
See application file for complete search history.

(56) References Cited

U.S. PATENT DOCUMENTS

| | | | | |
|---|---|---|---|---|
| 9,019,368 | B2 * | 4/2015 | Kim ................... | G01B 9/02007 348/135 |
| 2008/0316442 | A1 * | 12/2008 | Adel ................... | G03F 7/70258 355/52 |
| 2009/0310141 | A1 * | 12/2009 | Miyata ............... | G01B 9/02007 356/487 |
| 2014/0368831 | A1 * | 12/2014 | Ser ..................... | G01B 9/02002 356/491 |

FOREIGN PATENT DOCUMENTS

JP 10-78310 3/1998

* cited by examiner

*Primary Examiner* — Tarifur Chowdhury
*Assistant Examiner* — Md M Rahman
(74) *Attorney, Agent, or Firm* — Oblon, McClelland, Maier & Neustadt, L.L.P.

(57) ABSTRACT

A curvature measurement apparatus according to an embodiment includes: a laser beam emitting portion emitting a laser beam; a first polarization beam splitter separating the emitted laser beam into first and second laser beams in different polarization directions and in different travel directions; a mirror reflecting the first laser beam so that the first and second laser beams travel side by side to a substrate; a second polarization beam splitter transmitting the second laser beam mirror-reflected from the substrate and reflecting the first laser beam, mirror-reflected from the substrate, in a direction different from a travel direction of the second laser beam; a one-dimensional first position detection device detecting an incident position of the reflected first laser beam on the first position detection device; and a one-dimensional second position detection device detecting an incident position of the transmitted second laser beam on the second position detection device.

18 Claims, 7 Drawing Sheets

CURVATURE MEASUREMENT APPARATUS AND METHOD

CROSS-REFERENCE TO THE RELATED APPLICATION

This application is based on and claims the benefit of priority from Japanese Patent Applications No. 2014-065372, filed on Mar. 27, 2014, No. 2014-218948, filed on Oct. 28, 2014 and No. 2015-057144, filed on Mar. 20, 2015; the entire contents of which are incorporated herein by reference.

FIELD

Embodiments described herein relate generally to a curvature measurement apparatus and a curvature measurement method.

BACKGROUND

Manufacturing processes of semiconductor devices that require comparatively thick crystalline film, like power devices such as insulated gate bipolar transistors (IGBTs), have conventionally employed the epitaxial growth technique to form a single-crystal thin film on a substrate, such as a semiconductor wafer, by vapor-phase growth. In a film deposition apparatus used in the epitaxial growth technique, a substrate such as a wafer is placed within a deposition chamber maintained at atmospheric or reduced pressure. The placed substrate is heated while the raw material gas for film deposition (raw material gas) is supplied to the deposition chamber. This causes chemical reaction such as pyrolysis reaction or hydrogen reduction reaction of the raw material gas at the surface of the substrate, so that an epitaxial film is formed on the substrate.

The film deposition apparatus uses a curvature measurement apparatus (a warpage measurement apparatus) which measures the curvature of the substrate as a measurement object. The curvature measurement apparatus has been used mainly for optimizing the process procedure. In recent years, however, mass-production apparatuses have become required to perform constant monitoring of warpage by using the curvature measurement apparatus. In a process of forming gallium nitride (GaN) film on an 8-inch silicon wafer, for example, it is very important to monitor how much the wafer warps during the deposition process because silicon and GaN thin film have a difference in coefficient of thermal expansion and a large mismatch of crystal lattice constants, and moreover because the process employs film deposition conditions in which the temperature is repeatedly raised and lowered in a wide range. If the monitoring of warpage is neglected, the product quality of wafers can be degraded because rupture of wafers, small cracks in the deposited thin film, or the like may occur during the deposition or when the temperature is lowered after the deposition. Accordingly, the monitoring of warpage is necessary for optimization of the process procedure prior to mass production but is also necessary to preserve the product quality even in the mass production in which the conditions of the deposition chamber gradually change.

A current prevailing curvature measurement apparatus causes two or more laser beams to travel side by side and enter a substrate through a window of the deposition chamber, detects the positions of at least two laser beams which are reflected from the substrate and return through the aforementioned window, and reads the distance between the detected positions. Here, the measurement method using three or more laser beams is not different in principle from the measurement method using two laser beams. For the sake of simplification, the measurement method using only two laser beams is explained below. As the way of detecting two laser beams, generally employed is a CCD (charge-coupled device) two-point detection method that simultaneously detects the two laser beams with a single two-dimensional CCD. In this detection method, the two laser beams are incident on a same CCD surface (a light receiving surface) and the positions of the two laser beams on the CCD detection plane are obtained as two points in the pixels of the CCD. The distance between the detected points is calculated by image processing and is converted into a curvature.

However, in the aforementioned CCD two-point detection method, when the substrate significantly warps, the detected points sometimes coincide with each other and have no distance therebetween. In this case, although the substrate has a certain curvature, the curvature cannot be measured. Moreover, even if the detected points do not coincide with each other, the S/N ratio is lowered because of the resolution limitation of the CCD when the substrate warps significantly. Furthermore, when the distance between the detected points needs to be reduced for the purpose of reducing the size of the window through which the two laser beams pass, the conditions become more sever, and the S/N ratio is lowered.

DETAILED DESCRIPTION

Figure 1:
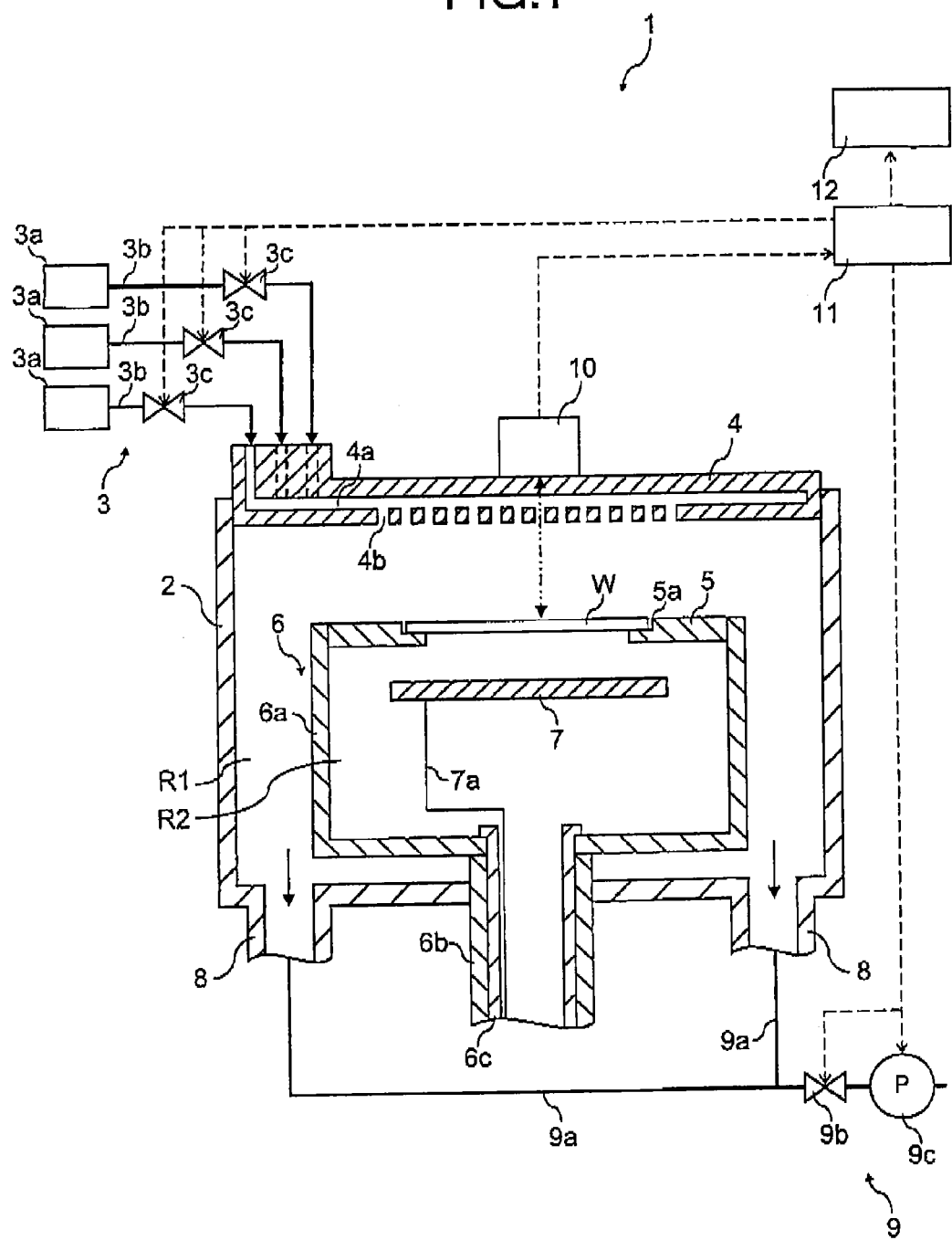
FIG. 1 is a view illustrating a schematic configuration of a film deposition apparatus according to a first embodiment.

According to one embodiment, a curvature measurement apparatus includes; a light emitting portion configured to emit a laser beam; a first polarization beam splitter configured to separate the laser beam emitted from the light emitting portion into a first laser beam and a second laser beam which are in different polarization directions and in different travel directions; a reflection portion configured to reflect any one of the first and second laser beams so that the first and second laser beams travel side by side to a measurement object; a second polarization beam splitter configured to transmit any one of the first and second laser beams mirror-reflected from the measurement object, and to reflect the other laser beam in a direction different from a travel direction of the one laser beam; a one-dimensional first position detection device configured to detect an incident position where the first laser beam reflected from or transmitted through the second polarization beam splitter is incident on the first position detection device; and a one-dimensional second position detection device configured to detect an incident position where the second laser beam transmitted through or reflected from the second polarization beam splitter is incident on the second position detection device.

According to another embodiment, a curvature measurement apparatus includes; a light emitting portion configured to emit a laser beam; a first polarization beam splitter configured to separate the laser beam emitted from the light emitting portion into a first laser beam and a second laser beam which are in different polarization directions and in different travel directions; a reflection portion configured to reflect the second laser beam so that the first and second laser beams travel side by side to a measurement object; a second polarization beam splitter configured to transmit any one of the first and second laser beams traveling toward the measurement object; a quarter-wave plate through which the first and second laser beams traveling toward the measurement object pass, and through which the first and second laser beams mirror-reflected from the measurement object pass; a first position detection device configured to detect an incident position where the first laser beam mirror-reflected from the measurement object and coming through the quarter-wave plate is incident on the first position detection device; and a second position detection device configured to detect an incident position where the second laser beam mirror-reflected from the measurement object and coming through the quarter-wave plate is incident on the second position detection device.

According to another embodiment, a curvature measurement method includes the steps of: emitting a laser beam by a light emitting portion; separating, by a first polarization beam splitter, the laser beam emitted by the light emitting portion into a first laser beam and a second laser beam which are in different polarization directions and in different travel directions; reflecting any one of the first and second laser beams by a reflection portion so that the first and second laser beams travel side by side to a measurement object; transmitting, through a second polarization beam splitter, any one of the first laser beam and the second laser beam mirror-reflected from the measurement object, and reflecting the other laser beam by the second polarization beam splitter in a direction different from a travel direction of the one laser beam; detecting, by a one-dimensional first position detection device, an incident position where the first laser beam reflected from or transmitted through the second polarization beam splitter is incident on the first position detection device; and detecting, by a one-dimensional second position detection device, an incident position where the second laser beam transmitted through or reflected from the second polarization beam splitter is incident on the second position detection device.

According to another embodiment, a curvature measurement method includes the steps of: emitting a laser beam by a light emitting portion; separating, by a first polarization beam splitter, the laser beam emitted from the light emitting portion into a first laser beam and a second laser beam which are in different polarization directions and in different travel directions; reflecting the second laser beam by a reflection portion so that the first and second laser beams travel side by side to a measurement object; transmitting, through a second polarization beam splitter, any one of the first and second laser beams traveling toward the measurement object; causing the first and second laser beams traveling toward the measurement object to pass through a quarter-wave plate, and causing the first and second laser beams mirror-reflected from the measurement object to pass through the quarter-wave plate; causing a first position detection device to detect an incident position where the first laser beam mirror-reflected from the measurement object and coming through the quarter-wave plate is incident on the first position detection device; and causing a second position detection device to detect an incident position where the second laser beam mirror-reflected from the measurement object and coming through the quarter-wave plate is incident on the second position detection device.

Various Embodiments will be described hereinafter with reference to the accompanying drawings.

(First Embodiment)

A first embodiment is described with reference to FIGS. 1 to 6.

As illustrated in FIG. 1, a film deposition apparatus 1 according to the first embodiment includes: a chamber 2 as a deposition chamber in which deposition is performed for a substrate W; a gas supply portion 3 configured to supply gas (raw material gas) to the substrate W in the chamber 2; a shower plate 4 located in upper part of the chamber 2; a susceptor configured to support the substrate W in the chamber 2; a rotary portion 6 configured to rotate while holding the susceptor 5; a heater 7 configured to heat the substrate W; a plurality of gas discharge portions 8 through which gas in the chamber 2 is discharged; an exhaust mechanism 9 configured to discharge gas through the gas discharge portions 8; a curvature measurement apparatus 10 configured to measure the curvature (an amount of warpage) of the substrate W; a controller 11 configured to control each component; and an informing portion 12 configured to give warning.

The chamber 2 functions as a deposition chamber (a reaction chamber) in which thin film is grown on the surface of the substrate W (a wafer as a semiconductor substrate, for example) by vapor-phase deposition to form an epitaxial film. The chamber 2 is formed in a box shape such as a cylindrical shape and accommodates the substrate W as s processing object and the like inside.

The gas supply portion 3 includes: a plurality of gas retention portions 3a individually retaining gases; a plurality of gas tubes 3b connecting the respective gas retention portions 3a to the shower plate 4; and a plurality of gas valves 3c changing the flow rates of gases flowing though the respective gas tubes 3b. The gas valves 3c are provided for the respective gas tubes 3b and are electrically connected to the controller 11. The controller 11 controls drive of each gas valve 3c.

The gas supply portion 3 supplies raw material gases for growing crystalline film on the surface of the substrate W heated by the heater 7, three kinds of gases, for example, into the chamber 2 through the shower plate 4. In the case of using a Si substrate as the substrate W and forming a GaN (gallium nitride) epitaxial film thereon using metal organic chemical vapor deposition (MOCVD), for example, a source gas of gallium (Ga) such as trimethyl gallium (TMG) gas, a source gas of nitrogen (N) such as ammonia ($NH_3$), and hydrogen gas as a carrier gas are used by way of example.

The aforementioned three kinds of gases are retained in the respective gas retention portions 3a and are supplied to the substrate W as the raw material gasses through the shower plate 4 like a shower, thus forming a GaN epitaxial film on the substrate W. The kinds of gases and the number of the kinds thereof are not particularly limited. In the case of forming a silicon carbide (SiC) epitaxial film on the substrate W, the three kinds of gasses including first to third gases, can be a source gas of carbon, a source gas of silicon, and a separating gas which is used to separate the source gasses. The separating gas lacks reactivity with the other two kinds of gasses.

The shower plate 4 is provided in upper part of the chamber 2 and has a plate shape with a predetermined thickness. The shower plate 4 includes gas supply channels 4a through which gasses flow and a number of gas discharge holes (gas jet holes) 4b connected to the respective gas supply channels 4a. The gas supply channels 4a and gas discharge holes 4b are structured so that the plural kinds of gasses (three kinds of gasses including the first to third gasses, for example) separated from each other can be directly jetted like a shower toward the substrate W without being mixed. For example, the gas supply channels 4a are independent of each other so as to prevent the gasses from being mixed and reacted to each other within the shower plate 4. In the shower plate 4, the gasses are unnecessarily supplied separately from each other and may be mixed to be supplied.

The shower plate 4 is configured to straighten the gasses for forming the epitaxial film and supply like a shower, the gasses through the individual gas discharge holes 4b toward the surface of the substrate W. The shower plate 4 can be made of a metallic material such as stainless steel or aluminum alloy, for example. The thus-configured shower plate 4 allows the raw material gas to uniformly flow in the chamber 2, so that the raw material gas can be uniformly supplied onto the substrate W.

The susceptor 5 is provided above the rotary portion 6 and has a ring shape provided with an opening 5a. The susceptor 5 is provided with a counterbore (a ring-shaped recess) on the inner circumference of the opening 5a so that the outer edge of the substrate W is received and supported in the counterbore. The susceptor 5 is composed of a carbon (C) material, such as isotropic graphite, coated with high-heat resistant and high-purity SiC by CVD, for example, because the susceptor 5 is exposed to high temperature. The susceptor 5 has a structure in which the opening 5a remains open as described above but is not limited to the above case. The susceptor 5 may have a structure in which the opening 5a is closed with a member configured to close the opening 5a, for example.

The rotary portion 6 includes: a cylindrical portion 6a holding the susceptor 5; and a hollow rotary body 6b serving as an axis of rotation of the cylindrical portion 6a. The cylindrical portion 6a has a structure open at the top, and the susceptor 5 is placed on the cylindrical portion 6a. When the substrate W is placed on the susceptor 5, the opening 5a of the susceptor 5 is covered to form a hollow region. In the rotary portion 6, the rotary portion 6b is rotated by a rotation mechanism (not shown), and the susceptor 5 is thereby rotated through the cylindrical portion 6a. The substrate W on the susceptor 5 rotates along with the rotation of the susceptor 5.

Herein, the space region within the chamber 2 is referred to as a first region R1, and a hollow region substantially separated from the first region R1 by the substrate W and susceptor 5 is referred to as a second region R2. As the first and second regions R1 and R2 are separated from each other, the surface of the substrate W is prevented from being contaminated with pollutants generated around the heater 7. Moreover, gas in the first region R1 is prevented from entering the second region R2 and coming into contact with the heater 7 located within the second region R2.

The heater 7 is provided within the cylindrical portion 6a, that is, within the second region R2. The heater 7 can be a resistive heater, for example, which is composed of a carbon (C) material such as isotropic graphite coated with high heat resistant SiC. The heater 7 is supplied with power through a wire 7a, which passes within a substantially cylindrical shaft 6c, to heat the rear surface of the substrate W. The shaft 6c is made of quartz and is provided within the rotary body 6b. The wire 7a is electrically connected to the controller 11, and the controller 11 controls power supply to the heater 7.

Within the shaft 6c, lift pins (not illustrated), a lift device (not illustrated), and the like are provided as a substrate lift mechanism. The lift device is capable of moving up and down the lift pins, and the lift pins are used when the substrate W is loaded into the chamber 2 and unloaded from the chamber 2. When the lift pins are moved up, the lift pins support the lower surface of the substrate W and lift the substrate W to separate the substrate W from the susceptor 5. The lift pins operate to place the substrate W at a predetermined upper position away from the susceptor 5 on the rotary portion 6 so that the substrate W is transferred to and received from a handling robot (not shown).

The gas discharge portions 8 are discharge holes through which the raw material gases after reaction are discharged and are provided in lower part of the chamber 2. The gas discharge portions 8 are located around the rotary portion 6 in the bottom of the chamber 2 and are connected to the exhaust mechanism 9 to exhaust gas.

The exhaust mechanism 9 includes: a plurality of gas exhaust channels 9a through which the raw material gases after reaction flow; an exhaust valve 9b changing the flow rate of the gas flowing through the valve; a vacuum pump 9c serving as a driving source for exhaust. The exhaust mechanism 9 is configured to discharge the raw material gas after reaction from the inside of the chamber 2 through each gas discharge portion 8. The exhaust valve 9b and vacuum pump 9c are electrically connected to the controller 11, and the drive thereof is controlled by the controller 11. The exhaust mechanism 9 is capable of adjusting pressure within the chamber 2 to a, predetermined pressure in accordance with the control by the controller 11.

The curvature measurement apparatus 10 is provided above the shower plate 4 and is configured to project and receive two laser beams to and from the substrate W placed on the susceptor 5 to measure the curvature of the substrate W placed on the susceptor 5 (described in detail below). Each laser beam is projected and received through a transparent part in the shower plate 4, which is located between the gas supply channels 4a, that is, a window of the chamber 2 (a window for transmitting laser beams). The curvature measurement apparatus 10 is electrically connected to the controller 11 and transfers the measured curvature (curvature information) to the controller 11.

The window of the chamber 2 has any one of various shapes including slit, rectangular, and circular shapes and is large enough that the laser beams can be projected onto and received from the substrate W therethrough. The window of the chamber 2 can be made of a transparent material such as quartz glass, for example.

The controller 11 includes a microcomputer which performs centralized control of each component and a storage portion storing deposition processing information concerning the deposition processing, various programs, and the like (not illustrated). The controller 11 controls the gas supply portion 3, the rotation mechanism of the rotary portion 6, the exhaust mechanism 9, and the like based on the deposition processing information and various programs for controlling gas supply to supply various gases from the gas supply portion 3 through the shower plate 4 onto the surface of the substrate W placed on the susceptor 5 rotating with the rotation of the rotary portion 6 and for controlling the heating of the substrate W by the heater 7. As the control of the gas supply portion 3, the individual operations of the gas valves 3c of the gas supply portion 3 are controlled so that supply of three kinds of gases are adjusted by properly setting the time and period to supply each of the three gasses, for example.

The controller 11 determines whether the curvature measured by the curvature measurement apparatus 10 reaches a predetermined setting value. When the controller 11 determines that the curvature measured by the curvature measurement apparatus 10 reaches the predetermined setting value, the controller 11 stops the deposition process and outputs an informing instruction to the informing portion 12. The setting value is previously set through an input portion (input devices such as a keyboard or a mouse, for example) by a user or the like and can be changed when needed.

When receiving the informing instruction from the controller 11, that is, when the curvature measured by the curvature measurement apparatus 10 reaches the predetermined setting value, the informing portion 12 informs a user that the substrate W has a problem in the warpage (a warning). The informing portion 12 can be one of various informing units including alarming devices such as lamps and buzzers, display units displaying letters, and audio output units outputting audio.

In the thus-configured film deposition apparatus 1, the rotary portion 6 is rotated to rotate the substrate W, and the substrate W is heated by the heater 7. Moreover, the three kinds of raw material gases are introduced into the chamber 2 through the shower plate 4 and are then supplied toward the surface of the substrate W like a shower, so that an epitaxial film is formed on the substrate W such as a wafer by vapor phase deposition. The shower plate 4 supplies the three kinds of gases to the substrate W placed within the chamber 2 without mixing the gases. In the film deposition apparatus 1, epitaxial film is formed using plural kinds of gases, that is, three kinds of gasses including the first to third gasses. However, the number of the kinds of gases is not limited to three and may be two or more than three, for example.

The substrate W can be transported into or out of the chamber 2 using a handling robot (not shown). In this process, the aforementioned substrate lift mechanism can be used. In the process of transporting the substrate W out of the chamber 2, the substrate W is raised by the substrate lift mechanism to be separated from the susceptor 5. The substrate W is then transferred to the handling robot and is transported to the outside of the chamber 2. In the process of transporting the substrate W into the chamber 2, the substrate lift mechanism receives the substrate W from the handling robot and then moves down the substrate W to place the substrate W on the susceptor 5.

Figure 2:
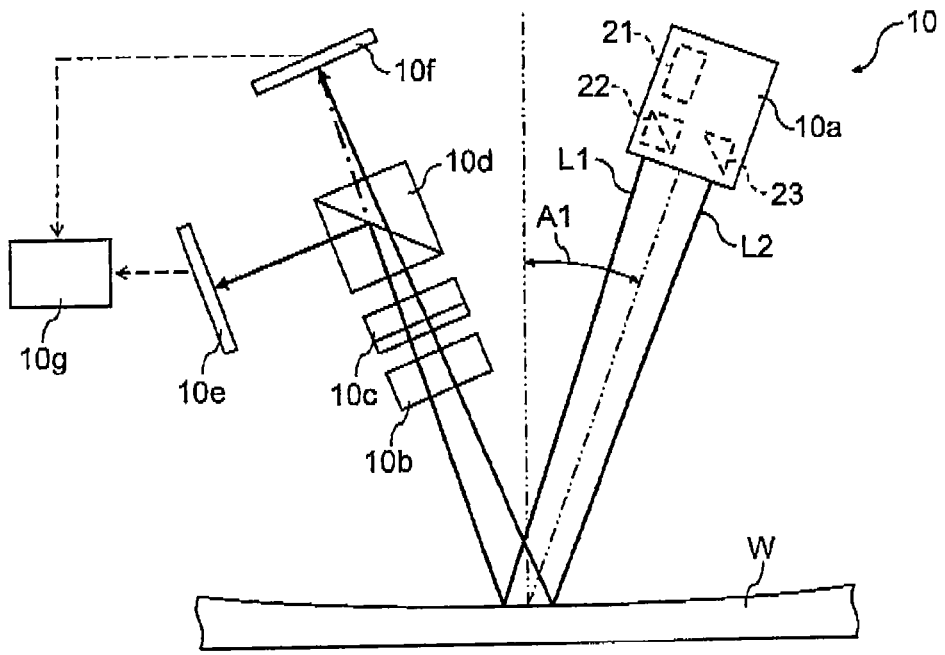
FIG. 2 is a front view illustrating a schematic configuration of a curvature measurement apparatus according to the first embodiment.
Figure 3:
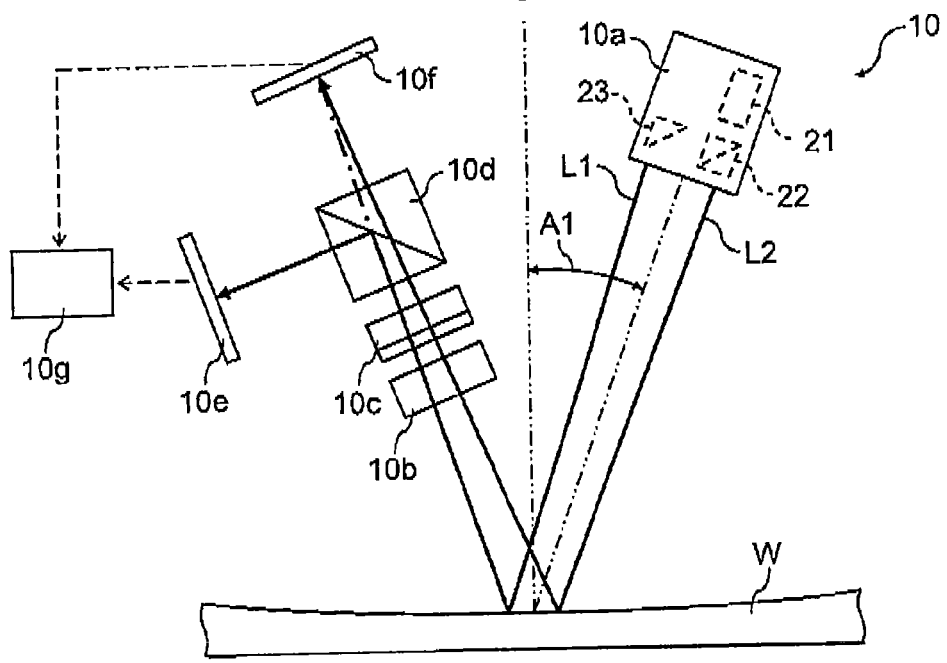
FIG. 3 is a front view illustrating a modification 1 of the curvature measurement apparatus according to the first embodiment.
Figure 4:
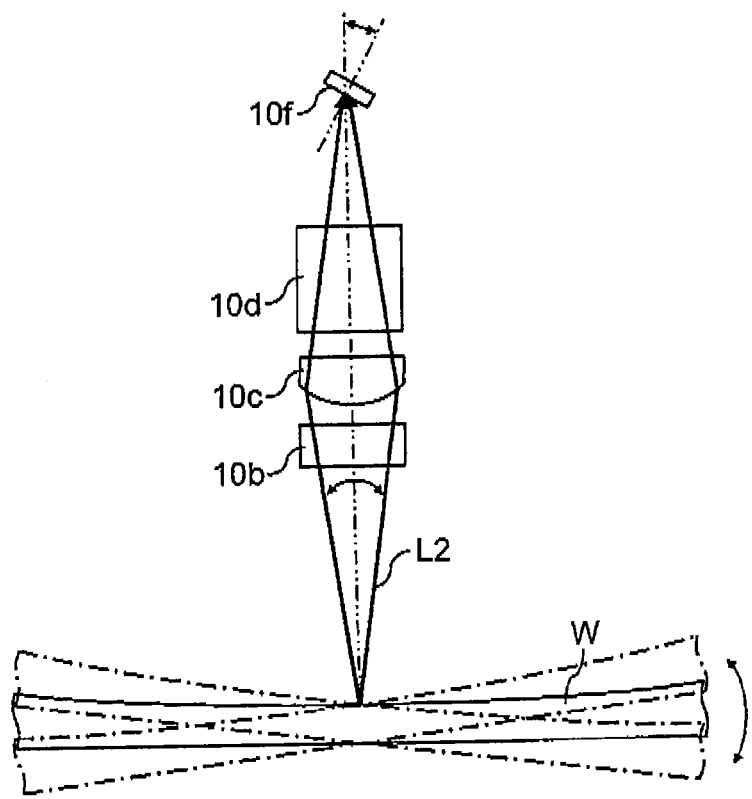
FIG. 4 is a side view illustrating a schematic configuration of the curvature measurement apparatus according to the first embodiment.

Next, the aforementioned curvature measurement apparatus 10 will be described in detail with reference to FIGS. 2 to 6. FIGS. 2 to 4 illustrate a schematic configuration of the curvature measurement apparatus 10 by using schematic figures of optical parts. In FIGS. 2 to 4, the distance between the curvature measurement apparatus 10 and the substrate W appears to be short. However, the actual distance therebetween is about 20 to 50 cm. The laser beams are transmitted through the window of the chamber 2. In addition, in FIGS. 2 and 3, a travel direction of a laser beam reflected by a polarization beam splitter is bent at an approximately perpendicular angle. However, in some cases, it is not necessary that this angle is particularly close to the perpendicular angle.

As illustrated in FIG. 2, the curvature measurement apparatus 10 includes a projection portion 10a, an optical filter 10b, a condenser lens 10c, a travel direction changing portion 10d, a one-dimensional first position detection device 10e, a one-dimensional second position detection device 10f, and a calculation portion 10g. The projection portion 10a causes two laser beams L1 and L2 to travel side by side and enter the substrate W as the measurement object. The optical filter 10b cuts off light having wavelengths other than the wavelength of the two laser beams L1 and L2. The condenser lens 10c focuses the two laser beams L1 and L2. The travel direction changing portion 10d separates the two laser beams L1 and L2 mirror-reflected from the substrate W. The first position detection device 10e detects the incident position where the first laser light L1 out of the two separated laser beams L1 and L2 is incident on the first position detection device 10e. The second position detection device 10f detects the incident position where the second laser light L2 out of the two separated laser beams L1 and L2 is incident on the second position detection device 10f. The calculation portion 10g calculates the curvature (the amount of warpage) of the substrate W using the incident positions of the laser beams L1 and L2 detected by the first and second position detection devices 10e and 10f.

The projection portion 10a causes the first and second laser beams L1 and L2 with different polarization directions, that is, with different polarization components (polarization planes) to travel side by side and enter the substrate W. The projection portion 10a includes a laser beam emitting portion (a light emitting portion) 21 emitting a laser beam; a polarization beam splitter (a first polarization beam splitter) 22, a mirror (a reflection portion) 23, and the like. In the projection portion 10a, the laser beam emitted from the laser beam emitting portion 21 is separated by the polarization beam splitter 22 into the s-polarization component (an s-polarized beam) and the p-polarization component (a p-polarized beam). The laser beam of the s-polarization component (the first laser beam L1) is caused to directly enter the substrate W, and the laser beam of the p-polarization component is reflected from the mirror 23 so as to travel side by side with the laser beam of the s-polarization component and enter the surface of the substrate W. The travel directions of the laser beams L1 and L2 do not need to be exactly parallel to each other. As described above, the polarization components (the polarization directions) include s- and p-polarization components which are perpendicular to the direction of propagation of light, for example. These s-polarization component and p-polarization component are orthogonal to each other. The polarization components (the polarization directions of the two laser beams) are not necessarily orthogonal to each other but preferably form an angle of not less than 70 degrees and not more than 90 degrees to separate them more accurately.

Here, the polarization beam splitter is an optical device including two prisms glued together at one joint surface. The joint surface has a dielectric multilayer film formed thereon in advance, and thus the polarization beam splitter is provided with a function to transmit light in a certain polarization direction through the joint surface, or to reflect light in another polarization direction by the joint surface. Appropriate designing of the structure of a multilayer film to be formed on the joint surface enables fabrication of a polarization beam splitter having a function to reflect a p-polarized beam and to transmit an s-polarized beam with respect to the joint surface, or reversely a polarization beam splitter having a function to reflect an s-polarized beam and to transmit a p-polarized beam with respect to the joint surface. To simplify the description, the former polarization beam splitter is called a p-polarized light reflection type or s-polarized light transmission type, and the latter polarization beam splitter is called an s-polarized light reflection type or p-polarized light transmission type. These polarization beam splitters having the different functions have their distinctive characteristics and can be used selectively for different appropriate purposes. In FIG. 2, the polarization beam splitter 22 to split a laser beam into two beams is of the s-polarized light transmission type, and a polarization beam splitter serving as the travel direction changing portion lad to split the two laser beams reflected from the measurement object (substrate W) depending on polarization directions is of the s-polarized light reflection type. FIG. 3 illustrates a case where the first embodiment having the configuration in FIG. 2 is modified by using only polarization beam splitters of the p-polarized light transmission type. As references for a polarization beam splitter of s-polarized light transmission type, there can be cited WO9707418(WO/1997/007418) or Li Li and J. A. Dobrowolski, "High-performance thin-film polarizing beam splitter operating at angles greater than the critical angle", Applied Optics, Vol. 39, No. 16, pp. 2754-71.

The incident positions at which the laser beams L1 and L2 are incident on the substrate W are around the center of the substrate W, for example, and an incident angle A1 thereof is desirably at least not more than 20 degrees (described in detail later). The originally emitted laser beam is desirably a laser beam with a wavelength of 700 nm or less, or more preferably 600 nm or less (532 nm, for example), which has high sensitivity in a silicon detecting system, for example and is less affected by heat radiation while avoiding an influence of light emission from the substrate W which is glowing red.

The optical filter 10b is provided between the substrate w and the travel direction changing portion 10d on the optical paths of the first and second laser beams L1 and L2 which travel side by side each other and cuts out (removes) light having wavelengths other than the wavelength of the first and second laser beams L1 and L2. The optical filter 10b can be composed of a monochromatic filter, for example. By providing the thus-configured optical filter 10b, light having wavelengths other than the wavelengths of the laser beams L1 and L2 (green light in the above example) is prevented from entering the position detection devices 10e and 10f. It is therefore possible to avoid the influence of light emission from the substrate W which is glowing red, thus increasing the position detection accuracy.

Note that the one-dimensional position detection device 10e or 10f is composed of a semiconductor position sensitive detector (PSD), for example. The PSD is configured to output the centroid (the position) of the distribution of each incident laser beam (the light spot intensity) and outputs the centroid as two electric signals (analogue signals). The PSD is sensitive to light in the visible light range. In the film deposition apparatus 1, the substrate W glows red, that is, emits light having wavelengths close to the wavelength of red light. The intensity of the laser beams L1 and L2 is significantly higher than that of the red light emitted from the substrate W glowing red. Accordingly, when the laser beams L1 and L2 are green laser beams whose wavelength is not close to at least the wavelength of red light, the red light from the substrate W cannot cause a problem. However, in the process of depositing a film in the film deposition apparatus 1, there occurs a time when almost no laser beams are reflected because of interference between the film and laser beams. At this time, the intensity of the red light emitted from the substrate W glowing red exceeds the intensity of the reflected laser beams, and the position of the laser beam reflected from the measurement object (substrate W) cannot be measured accurately or entirely on the position detection device 10e or 10f in some cases. In order to prevent this failure, it is desirable to provide the optical filter 10b which does not transmit light having a wavelength other than the wavelength used in the first embodiment. The position detection devices 10e and 10f can be individually composed of a solid-state image sensing device (a CCD, a CMOS, or the like).

In addition, in order to avoid the interference effect of the film deposited on the measurement object described above, it is effective to use a laser beam with a wavelength which can be absorbed by the deposited film as the laser beam of the first embodiment. More specifically, a laser beam having higher energy than a band gap of the deposited film can be cited. In the case where the deposited film absorbs the laser beam used in the first embodiment, the interference effect decreases as the deposited film becomes thicker, and the interference effect disappears when the film is deposited with a certain thickness or more. For example, in the case of GaN film deposition, GaN has an absorption end in the ultraviolet range (365 nm) at a room temperature, but absorbs light in the blue-violet range at a temperature of 700° C. or higher since the band gap becomes small. Accordingly, in the case where GaN is grown at a temperature of 700° C. or higher, use of a laser beam with 405 nm in the first embodiment reduces the interference effect of GaN.

The condenser lens 10c is provided between the substrate W and the travel direction changing portion 10d on the optical paths of the first and second laser beams L1 and L2 that travel side by side. The condenser lens 10c focuses the first laser beam L1 onto the element surface (the light receiving surface) of the first position detection device 10e in the direction perpendicular to the element array direction (short-side direction) of the first position detection device 10e. Moreover, the condenser lens 10c focuses the second laser beam L2 onto the element surface (the light receiving surface) of the second position detection device 10f in the direction perpendicular to the element array direction (short-side direction) of the second position detection device 10f. The condenser lens 10c can be composed of a half cylindrical lens.

As illustrated in FIG. 4 (the side view of FIG. 2), when the substrate W is inclined because of vibration or the like, the second laser beam L2 reflected by the substrate W wavers in a fan-like fashion around the point of the substrate W at which the second laser beam L2 is incident (the incident point). The first laser beam L1 also wavers in a fan-like fashion (which is not illustrated in FIG. 4 for simplification of the drawing). Accordingly, the condenser lens 10e is composed of a proper lens to focus the laser beams L1 and L2 so that the first laser beam L1 reflected by the substrate W does not deviate from the first position detection device 10e and that the second laser beam L2 reflected by the substrate W does not deviate from the second position detection device 10f. The first and second laser beams L1 and L2 wavering in the fan-like fashion because of the inclination of the substrate W can be therefore focused again at one point. In this case, if the condenser lens 10c is composed of a just circular lens, displacement information concerning the warpage of the substrate W is also eliminated in some cases. Accordingly, the condenser lens 10c is composed of the half cylindrical lens so as to prevent the displacement information of the laser beams L1 and L2 from being eliminated by focusing the laser beams L1 and L2 in the warpage information direction, that is, in the longitudinal direction of the position detection devices 10e and 10f.

The deflections of the laser beams L1 and L2 in the short-side direction of the respective position detection devices 10e and 10f are not of consequence because of the condenser lens 10e. On the other hand, the deflections thereof in the longitudinal direction are cancelled by taking a difference between displacements of the incident positions on the two position detection devices 10e and 10f, and are not of consequence. It is therefore possible to maintain the S/N. Even by the above-described methods, the laser beams L1 and L2 may deviate from the two position detection devices 10e and 10f. Such excessively large deflection occurs in a case where the film deposition apparatus 1 itself has a problem (abnormal vibration, assembly accuracy, and the like, for example) or a case where the substrate W gets out of the opening 5a of the susceptor 5. In an opposite way, appropriate monitoring of the signals from the curvature measurement apparatus enables quick finding of an abnormal state described above.

The travel direction changing portion 10d is configured to separate the first and second laser beams L1 and L2 which are mirror-reflected from the surface of the substrate W and to set the travel directions thereof largely different from each other. The travel direction changing portion 10d can be composed of a polarization beam splitter (a second polarization beam splitter), for example. The travel directions of the first and second laser beams L1 and L2 are changed within such ranges that the first laser beam L1 can be detected by the first position detection device 10e and the second laser beam L2 can be detected by the second position detection device 10f. Moreover, it is possible to add an optical part such as a mirror between the travel path changing portion 10d and the position detection device 10e or 10f and change the positions of the position detection device 10e or 10f.

The first position detection device 10e is a one-dimensional position detection device which receives the first laser beam L1 out of the first and second laser beams L1 and L2 separated by the travel direction changing portion 10d and detects the incident position (light receiving position) of the first laser beam L1 thereon. The first position detection device 10e is provided so that the direction normal to the element surface (light receiving surface) is inclined at an angle of 10 to 20 degrees with respect to the optical axis of the first laser beam L1.

The second position detection device 10f is a one-dimensional position detection device which receives the second laser beam L2 out of the first and second laser beams L1 and L2 separated by the travel direction changing portion 10d and detects the incident position (light receiving position) of the second laser beam L2 thereon. In a similar manner to the first position detection device 10e, the second position detection device 10f is provided so that the direction normal to the element surface (light receiving surface) is inclined at an angle of 10 to 20 degrees with respect to the optical axis of the second laser beam L1.

The aforementioned arrangement in which the direction normal to the detection surface of each of the position detection devices (the first and second position detection devices 10e and 10f) is inclined with respect to the incident laser beam prevents the laser beam reflected from the position detection device from returning to the foregoing optical system again (return light). The return light acts as noise on primarily-needed reflected light from the measurement object. The aforementioned inclined arrangement of the position detection device prevents the light reflected from the position detection devices 10e or 10f from entering the travel direction changing portion 10d, thus preventing the position detection accuracy from being reduced because of negative influence of the light reflected (return light) from the position detection devices 10e and 10f.

The calculation portion 10g calculates the curvature (the amount of warpage) of the substrate W using the incident position of the first laser beam L1 detected by the first position detection device 10e and the incident position of the second laser beam L2 detected by the second position detection device 10f. For example, the calculation portion 10g calculates a difference between the displacement of the incident position of the first laser beam L1 detected by the first position detection device 10e and the displacement of the incident position of the second laser beam L2 detected by the second position detection device 10f and uses the correlation between the calculated difference and the optical path lengths of the first and second laser beams L1 and L2 to calculate the amount of curvature change of the substrate W. The measured curvature can be converted into the absolute value of the curvature radius based on the curvature measured before displacement using calibration mirrors, a substrate not deformed, or the like.

The aforementioned correlation is expressed by a predetermined relational expression of: $(X1+X2)/2=w \times Y \times Z1$ as an example where X1 and X2 are displacements of the laser beams L1 and L2 on the corresponding position detection devices (the first and second position detection devices 10e and 10f), respectively, Y1 and Y2 are optical path lengths of the laser beams L1 and L2, respectively, Z1 is the amount of curvature change, and w is a distance between incident positions where the two laser beams are incident on the measurement object. Herein, Y is substituted for Y1 and Y2, because Y1 and Y2 are substantially equal to each other. The signs of X1 and X2 are set so that the displacements of the two laser beams L1 and L2 toward the center thereof have a same sign.

Herein, it is not realistic to strictly measure w and Y. On the other hand, w and Y do not change largely at measurement.

The above expression can be therefore changed to a simple relation: $Xtotal=C \times Z1$ ($Xtotal=X1+X2$), in which the total amount of displacements (that is, a change in geometrical distance between the two laser beams) is proportional to the curvature. This simple relation can be applied when C is determined using calibration mirrors (two types) having known curvature radii. The curvature radius of one of the two types of mirrors is as infinite as possible (that is, a plane), and the other mirror has the smallest curvature radius that can be assumed. Preferably, it can be confirmed that the linearity is established in the range of measurement (when the standard curve is produced with respect to Z1) by performing the curvature measurement for another mirror having a curvature radius between the curvature radii of the aforementioned calibration mirrors.

Preferably, the calculation portion 10g acquires the signals from the position detection devices 10e and 10f at predetermined times. For example, the calculation portion 10g acquires signals from the position detection devices 10e and 10f at the same time as acquiring each phase signal of periodic movement accompanied with the substrate W. The calculation portion 10g calculates the curvature by using only the position signals in an arbitrary phase range of the periodic movement. To be specific, in the case where the periodic movement is rotary movement (a Z-phase pulse of the motor), for example, the time to acquire the position signals is set to a time of each revolution of the motor of the rotation mechanism, so that the calculation portion 10g acquires the position signals from the position detection devices 10e and 10f in synchronization with the rotation of the motor. The position signals may include position information at an arbitrary point or an average of position information in an arbitrary range and preferably integration thereof. When calculation of the aforementioned processes is difficult, it is recommended that all of information of plural revolutions is acquired and averaged.

Figure 5:
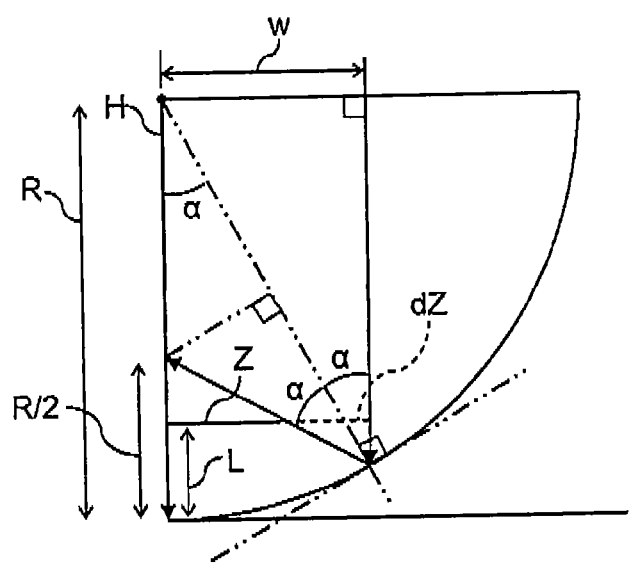
FIG. 5 is an explanatory diagram for explaining the distance between laser beams on a substrate surface according to the first embodiment.

Next, the distance between the laser beams on the surface of the substrate W (the distance between the first and second laser beams L1 and L2) will be described with reference to FIG. 5. FIG. 5 illustrates a model simplified for estimating the magnitudes of the displacements while the actual ones are more complicated.

As illustrated in FIG. 5, in a mirror surface with a curvature radius R (m), a line segment (a radius) extending from a tangent line to the mirror surface through the center of the mirror surface is indicated by H. A ray of light is assumed to be incident on the mirror surface in parallel to the line segment 11 and be reflected in the mirror surface. The point at which the reflected ray of light intersects the line segment H is approximated by a midpoint (R/2) of deformation as long as the curvature is not extremely large. Moreover, the displacement observation point in the curvature measurement apparatus 10 is approximated by a height L in FIG. 5, the displacement of the reflected ray of light observed when the curvature is changed is approximated by dZ, and the point of reflection of the incident ray of light is approximated by being at the same height as the lowest point of the circle.

Herein, when the straight-line distance between the line segment H and the incident ray of light is w (m), $dZ=w-Z=w-(R/2-L)\times\tan(2\alpha)$. Herein, $\tan(2\alpha)$ is approximated by $\tan(2\alpha)=2\alpha=2w/R$. Accordingly, dZ is expressed as $dZ=w-(R/2-L)\times 2 w/R=2 wL/R$.

Examination of the deposition situation of GaN based on changes in curvature radius of about 100 m by way of example reveals that it is preferable that the resolution of curvature change is at least 100 m, 500 m in practice, and 1000 m if possible. On the other hand, the position detection devices 10e and 10f are desirably distant from the substrate W as described above. However, the distance between the substrate W and each of the position detection devices 10e and 10f is reasonably set to 20 to 50 cm because it is actually necessary to consider disturbance (air fluctuation) due to air convection on the optical paths and installation in the apparatus casing. Herein, when the curvature radius R is set to 500 m or more and the distance L is set to 30 cm, the above expression is: $dZ=0.0012$ w.

However, the displacement dZ has a lower limit depending on the performance of the light receiving elements. In the case of a CCD, for example, the pitch of elements is about 1 μm unless the CCD is extremely expensive and is of extremely high performance. PSD is an analogue device, and the limit of the spatial resolution of the element itself is not explicit. However, the appropriate range of the displacement dZ is from 10 nm to 0.1 μm in the light of the performance of a general-purpose logger configured to load the signals. Even if a high-performance logger is used, air disturbance or the like makes it difficult to recognize nanometer-scale changes. Actually, it is therefore practical in most cases if displacement of about 1 μm can be recognized. Accordingly, it is preferable that w is not less than 1 mm based on the aforementioned expression.

On the other hand, in the case of large curvature and large displacement, the distance between the laser beams needs to be limited so that the laser beams are within the light receiving range of the light receiving devices and the optical devices in the light focusing system. The curvature radius becomes less than 1 m in some cases and may be assumed to be down to R=0.5 m as a measurable range. In this case, $dZ=1.2$ w. In comparatively general purpose and accessible CCDs and PSDs, the light receiving size is about 10 mm square to 20 mm square. Accordingly, w can be 8 to 16 mm in order that the displacement is within the light receiving range. However, optical devices used on the optical path to the light receiving devices are often limited to 10 mm square when small devices are selected to reduce the cost, for example. In other words, the displacement width needs to be less than or comparable to 10 mm. Accordingly, w is 8 mm or less and preferably about 4 mm or less in consideration of the margins for positive and negative changes of the optical path.

As described above, the straight-line distance (laser beam distance) w between the straight line H and the ray of light is preferably 8 mm or less or 4 mm or less, and is also preferably 1 mm or more, as described above. Accordingly, w is preferably in a range of 1 mm<=w<==8 mm and more preferably in a range of 1 mm<=w<=4 mm.

If the two optical paths overlap each other on the surface of the substrate W (that is, if being incident at a same point), the optical paths have a same inclination at the reflection point. In other words, the optical paths are inclined at a same angle in a same direction. The method using two laser beams is configured to calculate warpage (curvature) from the difference in inclination between the two laser beams and cannot detect the laser beams which are the same in principle. There is a need to separate the incident points from each other even a little. On the other hand, as the distance between the incident points of the two laser beams on the surface of the substrate W increases, the difference in inclination between the reflected laser beams increases, and the sensitivity of the curvature measurement apparatus 10 increases. However, it is difficult to provide a large window for the chamber 2 in the film deposition apparatus 1. Accordingly, it is desirable to set the laser beam distance within the aforementioned range. However, the laser beam distance can be set departing from the aforementioned range depending on various conditions (the maximum size of the window that can be provided for the chamber 2, for example).

Next, the incident angle of laser beams to the surface of the substrate W (the incident angles of the first and second laser beams L1 and L2) will be described with reference to FIG. 6.

Figure 6:
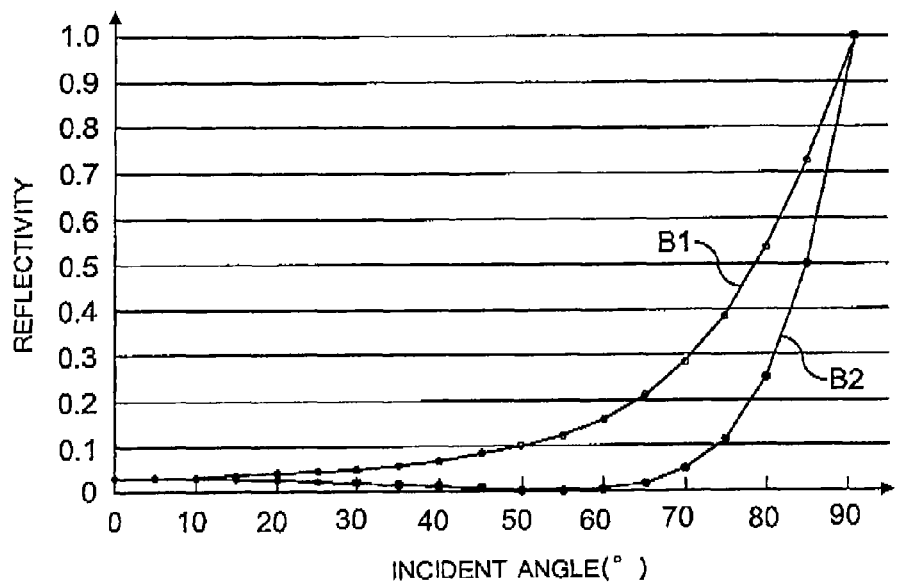
FIG. 6 is a graph showing the relations between incident angle and reflectance of s-polarized light and p-polarized light according to the first embodiment.

FIG. 6 shows the dependence of the reflectivity on the incident angle (the relation between the incident angle and the reflectivity) in the case where the substrate W is made of quartz. Graph B1 is a graph in the case where the incident light is s-polarized, and graph B2 is a graph in the case where the incident light is p-polarized. As shown by graphs B1 and B2, when s- and p-polarized beams travel in parallel toward the incident surface at an incident angle of 0 degree, the reflectivities of the beams are the same. Moreover, the reflectivities of the beams are the substantially same when the incident angles thereof are in a range from 0 to about 10 degrees or to about 20 degrees. In order to make the reflectivities of the s- and p-polarized beams approximately equal to each other, it is desirable to set the incident angle A1 of the beams (see FIG. 2) to at least lower than 20 degrees.

The curvature measurement apparatus 10 described above monitors warpage of the substrate W in the aforementioned process of forming epitaxial film. In this warpage monitoring, the first and second laser beams L1 and L2 having different polarization directions are projected by the projection portion 10a and are incident side by side on the surface of the substrate W. Subsequently, the first and second laser beams L1 and L2 mirror-reflected from the substrate W pass through the optical filter 10b side by side. After passing through the condenser lens 10c, the first and second laser beams L1 and L2 are separated by the travel direction changing portion 10d. The separated first and second laser beams L1 and L2 are focused in the short-side directions of the first and second position detection devices 10e and 10f as a result of the effect of the condenser lens 10c. Of the separated laser beams L1 and L2, the first laser beam L1 is detected by the first position detection device 10e, and the second laser beam L2 is detected by the second position detection device 10f.

Thereafter, the incident positions of the first and second laser beams L1 and L2 are used by the calculation portion 10g for calculation of the curvature (the amount of warpage) of the substrate W. For example, the difference between the displacements of the incident positions of the first and second laser beams L1 and L2 is calculated, and based on the correlation between the calculated difference and the optical path lengths, the amount of curvature change (curvature) of the substrate W is calculated. When the calculated curvature is input to the controller 11, the controller 11 determines whether the received curvature is larger than the predetermined setting value. When determining that the curvature measured by the curvature measurement apparatus 10 is larger than the predetermined setting value, the controller 11 can perform processing such as stopping the deposition process and outputting an informing instruction to the informing portion 12. Upon receiving the informing instruction from the controller 11, the informing portion 12 can perform processing such as informing the user that the substrate W has a problem in warpage (warning).

Herein, in a conventional CCD two-point measurement method, as described above, the detected two points sometimes coincide with each other when the substrate W warps greatly. In this case, having no distance between the detected points, the conventional method includes an unmeasurable region. On the other hand, according to the first embodiment, the two laser beams L1 and L2 are forcibly separated by the polarization thereof and the travel direction changing portion 10d irrespective of where the laser beams L1 and L2 overlap each other. Moreover, the positions of the laser beams L1 and L2 are calculated as displacements from the respective original positions, and the change in the distance between the laser beams L1 and L2 can be obtained by only using subtraction. Accordingly, there is no unmeasurable region that can exist in the conventional CCD two-point measurement method, and the S/N ratio is not lowered therearound. Moreover, in the conventional CCD two-point measurement method, it is necessary to adjust (set) the optical paths so as to avoid the unmeasurable region. However, according to the first embodiment, the aforementioned restriction is eliminated, so that the adjustment robustness is increased.

The laser beams L1 and L2 of the curvature measurement apparatus 10 pass through the window of the chamber 2, but the window of the chamber 2 tends to incline because of various factors. Examples of the various factors are deformation of the chamber 2 due to heat, displacement thereof due to vibration, and the like. Moreover, the substrate W measured by the curvature measurement apparatus 10 is subject to periodic vibration by the rotation. The laser beams L1 and L2 are focused by the condenser lens 10c so that the first laser beam L1 does not deviate from the position detection device 10e and the second laser beam L2 does not deviate from the second position detection device 10f even when the window is inclined or the substrate W periodically vibrates. In other words, the first and second laser beams L1 and L2 wavering in the fan-like fashion because of the inclination of the window or the periodic vibration of the substrate W are again focused at one point. This can prevent the accuracy of curvature measurement from being reduced by the inclination of the window or the periodic vibration of the substrate W.

As described above, according to the first embodiment, the first and second laser beams L1 and L2 having different polarization directions enter the substrate W side by side, and the travel paths of the first and second laser beams L1 and L2 mirror-reflected by the substrate W are changed by the travel direction changing portion 10d so that the first and second laser beams L1 and L2 are not mixed. The first and second laser beams L1 and L2 whose travel directions are changed are detected by the first and second position detection devices 10e and 10f, respectively. Accordingly, the points of the first and second laser beams L1 and L2 do not coincide with each other on the surface of the position detection devices unlike the conventional CCD two-point measurement method. Even when the two laser beams L1 and L2 overlap each other, the two laser beams L1 and L2 are separated and are detected by the two position detection devices 10e and 10f, respectively. According to the first embodiment, therefore, unmeasurable situations that can occur in the conventional CCD two-point measurement method do not occur, and degradation of the S/N ratio can be prevented even when the substrate W warps largely or the distance between the laser beams L1 and L2 is shortened. It is therefore possible to prevent the curvature from becoming unmeasurable and increase the accuracy of the curvature measurement.

(Second Embodiment)

Figure 7:
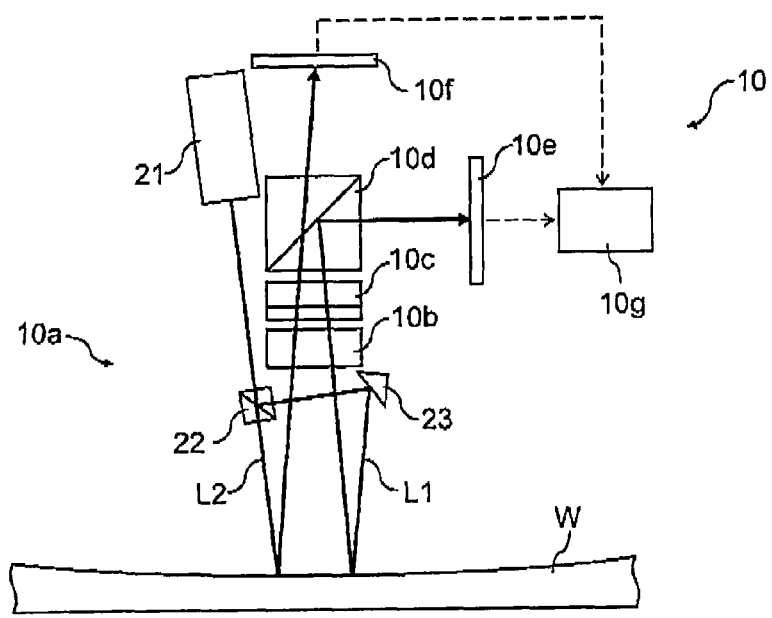
FIG. 7 is a front view illustrating a schematic configuration of a curvature measurement apparatus according to a second embodiment.

A second embodiment is described with reference to FIG. 7. Zn the second embodiment, the different points from the first embodiment (the part arrangement of the curvature measurement apparatus 10) are described, and the other description is omitted. FIG. 7 illustrates a schematic configuration of the curvature measurement apparatus 10 by using schematic figures of optical parts as similar to FIGS. 2 to 4 described above. In FIG. 7, the distance between the curvature measurement apparatus 10 and the substrate W appears to be short. However, the actual distance therebetween is about 20 to 50 cm. The laser beams are transmitted through the window of the chamber 2. In addition, in FIG. 7, a travel direction of a laser beam reflected by a polarization beam splitter is bent at an approximately perpendicular angle. However, in some cases, it is not necessary that this angle is particularly close to the perpendicular angle.

As illustrated in FIG. 7, a projection portion 10a of the curvature measurement apparatus 10 according to the second embodiment includes: the laser beam emitting portion (light emitting portion) 21 emitting a laser beam; the polarization beam splitter 22 separating the emitted laser beam into a first laser beam L1 (an s-polarized beam) and a second laser beam L2 (a p-polarized beam) L2; and the mirror 23. The polarization beam splitter 22 is provided between the laser beam emitting portion 21 and the surface of the substrate W on the optical path, and the mirror 23 is provided at such a position that the first laser beam L1 separated by the polarization beam splitter 22 is reflected toward the surface of the substrate W.

In the projection portion 10a, the laser beam emitted from the laser beam emitting portion 21 is separated into the first and second laser beams L1 and L2. The second laser beam L2 is caused to directly enter the substrate W. The first laser beam L1 is reflected by the mirror 23 so as to travel side by side with the second laser beam L2 and is then caused to enter the surface of the substrate W.

The optical filter 10b, condenser lens 10c, travel direction changing portion 1ad, and second position detection device 10f are provided on approximately the normal line to the substrate W. The first position detection device 10e is provided at such a position that the first position detection device 10e can detect the first laser beam L1 whose travel direction is changed by the travel direction changing portion 10d. Both the two beam splitters 22, 10d used in the second embodiment having the configuration illustrated in FIG. 7 are polarization beam splitters of the p-polarized light transmission type.

In the thus-configured curvature measurement apparatus 10, the four optical paths including incident light paths of the first and second laser beams L1 and L2 and reflected light paths of the first and second laser beams L1 and L2 are adjusted so ac to extend in a substantially same plane. Moreover, the reflected beam paths are adjusted so as to be sandwiched between the incident light paths. In all of the optical paths including the incident and reflected light paths passing through the window of the chamber 2, therefore, the distance between the optical paths located at the outside can be shortened. The window of the chamber 2 through which the laser beams L1 and L2 are transmitted can be reduced in size, so that the accuracy of detected positions can be prevented from being reduced by inclination of the window due to heat or the like.

As described above, according to the second embodiment, it is possible to obtain the same effects as those of the first embodiment, and it is therefore possible to prevent the curvature from becoming unmeasurable and increase the accuracy of curvature measurement. Moreover, the window of the chamber 2 through which the laser beams L1 and L2 pass can be reduced in size, and it is therefore possible to prevent the accuracy of detected positions from being reduced by inclination of the window due to heat or the like.

(Supplement of the First and Second Embodiments Described Above)

Listed herein are some of the various characteristics of the first and second embodiments described above.

The incident angles of the laser beams, that is, the first and second laser beams L1 and L2 onto the substrate W are at least not higher than 20 degrees (see FIG. 2). When the first and second laser beams L1 and L2 are s- and p-polarized beams, respectively, the reflectivities thereof are thereby substantially equal to each other (see FIG. 6), thus increasing the accuracy of position detection.

The optical paths of the first and second laser beams are adjusted so as to intersect each other on the element surface (the light receiving surface) of the second position detection device 10f in the absence of the travel direction changing portion 10d (see FIG. 2). Accordingly, the distance between the optical paths of the first and second laser beams L1 and L2 can be short, so that the travel direction changing portion 10d can be miniaturized. Desirably, the aforementioned intersection is located at the center of the second position detection device 10f in the longitudinal direction. With this arrangement, even if the incident position of the laser beam L1 or L2 on the light receiving surface of the position detection device 10e or 10f is displaced due to periodic vibration of the substrate W or the like, there is a low possibility that the incident position comes to an extreme end of the light receiving surface or gets out of the light receiving surface. Thus, a reduction in the position detection accuracy can be suppressed.

The light receiving surface (the first light receiving surface) of the first position detection device 10e is inclined at an angle of at least 10 degrees with respect to the optical axis of the first laser beam L1 (the optical axis of the incident light). Similarly, the light receiving surface (the second light receiving surface) of the second position detection device 10f is inclined at an angle of at least 10 degrees with respect to the optical axis of the second laser beam L2 (the optical axis of the incident light). This makes it possible to prevent light reflected from the position detection device 10e or 10f from entering the travel direction changing portion 10d and thereby preventing the position detection accuracy from being reduced by negative influence of the reflected light.

The optical filter 10b, which does not transmit light having wavelength other than the wavelengths of the first and second laser beams L1 and L2 and therearound, is provided on the optical paths from the substrate W to the travel direction changing portion 10d. This prevents light having wavelength other than the wavelengths of the first and second laser beams L1 and L2 (green, for example) and wavelength therearound from entering the position detection devices 10e and 10f. Accordingly, it is possible to avoid the influence of light emission from the substrate W which is glowing red and thereby increase the position detection accuracy.

The calculation portion 10g acquires signals from the position detection devices 10e and 10f at the same time as acquiring phase signal of periodic movement of the substrate W and calculates the curvature by using only the position signals at an arbitrary phase of the periodic movement. For example, in the case where the periodic movement is rotary movement, the time to acquire the position signals is set to a time in each revolution of the motor (each Z phase pulse of the motor) of the rotation mechanism, and the calculation portion 10g thereby acquires the signals from the position detection devices 10e and 10f in synchronization with rotation of the motor. Accordingly, even when the substrate W is subject to vibration due to periodic movement, the position signals can be acquired and used in synchronization with the periodic movement, preventing the position detection accuracy from being reduced by periodic vibration. The position detection accuracy can be therefore increased compared with the case where the position signals are acquired and used not in synchronization with the periodic movement.

At least any one of the one-dimensional position detection devices 10e and 10f is composed of a semiconductor position sensitive detector (PSD), which outputs the centroid of the distribution of an incident laser beam as two electric signals. Alternatively, at least any one of the one-dimensional position detection devices 10e and 10f is composed of a solid state image sensor (a CCD, for example). Herein, the conventional CCD two-point measurement method determines the distance between two points through complex image processing and requires a high-speed computer, thus increasing in cost. On the other hand, if the processing speed is sacrificed in order to prevent an increase in cost, the apparatus performance is reduced. In the case of using PSDs, image processing is unnecessary, and the calculation portion 10g only needs to acquire analog signal from each PSD and execute a simple calculation such as four arithmetic operations, thus preventing an increase in cost and reduction in the performance of the curvature measurement apparatus. In the case of using CCDs, the incident position can be known by easy image processing compared with two-dimensional image processing, thus preventing an increase in cost and reduction in the performance of the curvature measurement apparatus.

In the second embodiment, all the four optical paths, including incident light paths of the first and second laser beams L1 and L2 and reflected light paths of the first and second laser beams L1 and L2, are adjusted to extend in a substantially same plane. Moreover, the reflected light paths are adjusted so as to be sandwiched between the incident light paths. In all the optical paths including the incident and reflected light paths passing through the window of the chamber 2, therefore, the distance between the optical paths located at the outside can be shortened. Accordingly, the window of the chamber 2 through which the laser beams L1 and L2 pass can be reduced in size, thus preventing the detection position accuracy from being reduced by inclination of the window due to heat or the like.

(Third Embodiment)

Figure 8:
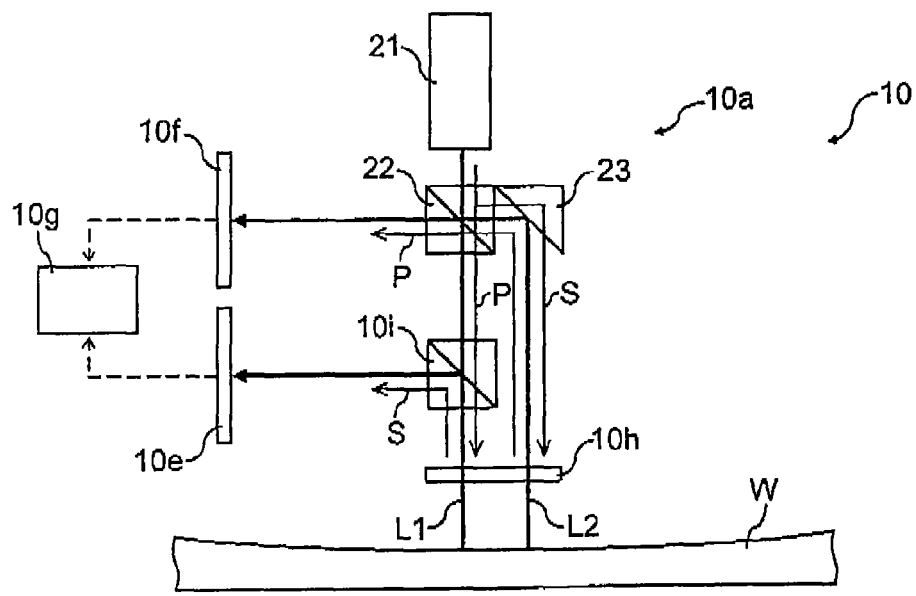
FIG. 8 is a front view illustrating a schematic configuration of a curvature measurement apparatus according to a third embodiment.

A third embodiment will be described with reference to FIG. 8. In the third embodiment, the different points from the first embodiment (the part arrangement and configuration of the curvature measurement apparatus 10) are described, and the other description is omitted. FIG. 8 illustrates a schematic configuration of the curvature measurement apparatus 10 by using schematic figures of optical parts. In FIG. 8, the distance between the curvature measurement apparatus 10 and the substrate W appears to be short as similar to FIGS. 2 to 4 described above. However, the actual distance therebetween is about 20 to 50 cm. The laser beams are transmitted through the window of the chamber 2. In addition, in FIG. 8, a travel direction of a laser beam reflected by a polarization beam splitter is bent at an approximately perpendicular angle. However, in some cases, it is not necessary that this angle is particularly close to the perpendicular angle.

As illustrated in FIG. 8, a curvature measurement apparatus 10 according to the third embodiment is configured to measure the curvature of the substrate W as the measurement object by using incident and reflected beams normal to the surface of the substrate W, unlike the first embodiment (also unlike the second embodiment). The incident angle of each laser beam is 0 degree, and the incident beam and reflected beam have the same optical axis.

The curvature measurement apparatus 10 includes the projection portion 10a, first position detection device 10e, second position detection device 10f, and calculation portion 10g and further includes: a quarter-wave plate 10h through which the two laser beams L1 and L2 pass; and a polarization beam splitter 10i which reflects the first laser beam L1 among the two laser beams L1 and L2 mirror-reflected from the surface of the substrate W. The polarization beam splitter 10i is provided instead of the travel direction changing portion 10d according to the first embodiment.

The projection portion 10a includes: the laser beam emitting portion (the light emitting portion) 21 emitting a laser beam; the polarization beam splitter (the first polarization beam splitter) 22 separating the emitted laser beam into the first laser beam L1 (a p-polarized beam) and the second laser beam L2 (an s-polarized beam); and the mirror 23 reflecting the second laser beam L2.

The polarization beam splitter (the first polarization beam splitter) 22 is provided between the laser beam emitting portion 21 and the surface of the substrate W, that is, on the optical path of the first laser beam L1 which is emitted from the laser beam emitting portion 21 and is normally incident on the surface of the substrate W. The polarization beam splitter 22 substantially transmits p-polarized light and substantially reflects s-polarized light (which bends only the s-polarized light by 90 degrees, for example).

The mirror 23 reflects the second laser beam (s-polarized beam) L2 separated by the polarization beam splitter 22 so that the second laser beam L2 travels toward the surface of the substrate W in parallel to the first laser beam L1 (p-polarized beam). The mirror 23 also functions as a reflector configured to reflect the second laser beam L2 (p-polarized beam) which is mirror-reflected from the surface of the substrate W and then passes through the quarter-wave plate 10h (the mirror 23 bends the s- and p-polarized light by 90 degrees, for example).

The first position detection device 10e detects the incident position of the first laser beam L1 which is mirror-reflected from the surface of the substrate W and then reflected from the polarization beam splitter 10i. The second position detection device 10f detects the incident position of the second laser beam L2 which is mirror-reflected from the surface of the substrate W and then reflected from the mirror 23. The first and second position detection devices 10e and 10f are located on a same line, for example, but are not limited to this arrangement.

The quarter-wave plate 10h is provided on both of the optical path of the first laser beam L1 which is normally incident on the surface of the substrate W and the optical path of the second laser beam L2 which is incident on the surface of the substrate W in parallel to the first laser beam L1. The quarter-wave plate 10h is a member through which the first laser beam L1 normally incident on the surface of the substrate W and the second laser beam 12 incident on the surface of the substrate W in parallel to the first laser beam L1 pass and through which the first and second laser beams L1 and 12 mirror-reflected from the surface of the substrate W pass.

Each of the laser beams L1 and L2 has a property of being subject to change of the polarization direction by 90 degrees when passing through the quarter-wave plate 10h twice (the laser beams L1 and L2 are circularly polarized when passing through the quarter-wave plate 10h once). Accordingly, when passing through the quarter-wave plate 10h twice, the p-polarized light is subject to change of the polarization direction by 90 degrees into s-polarized light. On the other hand, when passing through the quarter-wave plate 10h twice, the s-polarized light is subject to change of the polarization direction by 90 degrees into the p-polarized light. Herein, circularly-polarized light is obtained by setting the optical axis of the quarter-wave plate at 45 degrees with respect to the polarization plane. Accordingly, the optical axis is adjusted to the middle between the polarization directions of the first and second laser beams L1 and L2 whose polarization directions are orthogonal to each other, so that the quarter-wave plate 10h is given a condition in which the two laser beams L1 and L2 are symmetric.

The polarization beam splitter (the second polarization beam splitter) 10i is provided on the optical path of the first laser beam L1 which is incident in the normal direction on the surface of the substrate W and is configured to reflect the first laser beam L1 (the s-polarized beam) mirror-reflected in the normal direction from the surface of the substrate W towards the first position detection device 10e. The polarization beam splitter 10i substantially transmits the p-polarized light and substantially reflects the s-polarized light (which bends only the s-polarized light by 90 degrees, for example).

The curvature measurement apparatus 10 monitors warpage of the substrate W in the aforementioned deposition process of epitaxial film. In the warpage monitoring, when a laser beam is emitted from the laser beam emitting portion 21, first, the laser beam is separated by the polarization beam splitter 22 into the first laser beam L1 (p-polarized light) and the second laser beam L2 (s-polarized light) whose polarization directions differ by 90 degrees. Subsequently, the first laser beam L1 passes through the polarization beam splitter 10i and quarter-wave plate 10h and is then normally incident on the surface of the substrate W. The second laser beam L2 is reflected by the mirror 23 to travel parallel to the first laser beam L1 and then passes through the quarter-wave plate 10h to be incident on the surface of the substrate W.

Next, the first laser beam L1 mirror-reflected from the surface of the substrate W passes through the quarter-wave plate 10h to be subject to change of the polarization direction into s-polarized light. The first laser beam L1 (s-polarized light) is reflected from the polarization beam splitter 10i and enters the first position detection device 10e to be detected by the first position detection device 10e. Moreover, the second laser beam L2 mirror-reflected from the Surface of the substrate w passes through the quarter-wave plate 10h to subject to change of the polarization direction into p-polarized light. The second laser beam L2 (p-polarized light) is reflected from the mirror 23 toward the polarization beam splitter 22 and then passes through the polarization beam splitter 22. The second laser beam L2 then enters the second position detection device 10f to be detected by the second position detection device 10f. The subsequent processes (curvature calculation of the substrate W, informing of warning, and the like) are the same as those of the first embodiment.

Between the first position detection device 10e and polarization beam splitter 10i on the optical path of the first laser beam L1 or between the second position detection device 10f and the polarization beam splitter 22 on the optical path of the second laser beam L2, a direction changing portion such as a direction changing mirror or the like may be provided so as to reflect each laser beam L1 or L2 upward in FIG. 8, for example. In this case, the flexibility in arrangement of the first and second position detection device 10e and 10f can be increased.

Moreover, the optical path of the first laser beam L1 between the first position detection device 10e and polarization beam splitter 10i can be set not parallel to the optical path of the second laser beam L2 between the second position detection device 10f and the polarization beam splitter 22 by inclining the polarization beam splitter 22, mirror 23, the polarization beam splitter 10i, and the like while maintaining the configuration in which the first laser beam L1 is normally incident on the surface of the substrate W and the second laser beam L2 is incident on the surface of the substrate W in parallel to the first laser beam L1.

Figure 9:
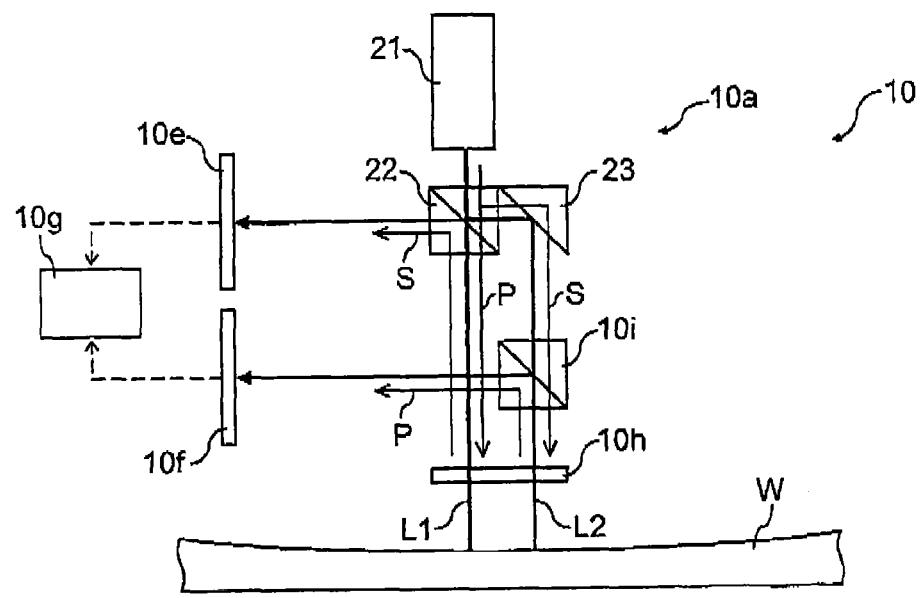
FIG. 9 is a front view illustrating a modification of the curvature measurement apparatus according to the third embodiment.

Both the two beam splitters 10i, 22 used in the third embodiment illustrated in FIG. 8 are of the p-polarized light transmission type. Instead, these two beam splitters may achieve the same or similar functions even if they are of the s-polarized light transmission type. In addition, the first and second polarization beam splitters 22, 10i may be of different polarized light transmission types (p-polarized and s-polarized light transmission types). In this case, as illustrated in FIG. 9, the second polarization beam splitter 10i is placed between the mirror 23 and the quarter-wave plate 10h on the optical path of the second laser beam L2. The first position detection device 10e detects the position of the first laser beam L1 reflected by the first polarization beam splitter 22, and the second position detection device 10f detects the position of the second laser beam L2 reflected by the second polarization beam splitter 10i.

In recent years, the window of the chamber 2 is getting smaller, and the restriction on the window becoming severer. In order to implement reduction of noise for the restriction of the space in the chamber 2 and deformation of the window while addressing the miniaturization of the window, it is desirable to perform measurement by normal incidence and reflection and reduce the loss in light intensity during the measurement by normal incidence and reflection. Since the laser beam is separated by the polarization beam splitter 22 into the first and second laser beams L1 and L2 as described above, the light intensity of each laser beam L1 and L2 is half that of the originally emitted laser beam. However, after the separation, the light intensity of each of the first and second laser beams is little reduced even when the first and second laser beams L1 and L2 are reflected by the optical system including the polarization beam splitter 10i and mirror 23. The loss in light intensity can be therefore reduced. Accordingly, light is not significantly reduced (is not subject to unnecessary dispersion) from light incidence to reflection in the measurement by normal incidence and reflection, thus reducing the loss in light intensity.

Moreover, in the measurement by normal incidence and reflection, the first and second laser beams L1 and L2 have polarization directions maintained orthogonal to each other after being separated from each other. Accordingly, even when the two laser beams L1 and L2 overlap each other because of any factor, it is possible to prevent the curvature from becoming unmeasurable and also increase the curvature measurement accuracy. Moreover, the measurement by normal incidence and reflection may be configured so that the directions of only the reflected beams are changed toward the detectors such as the first and second position detection devices 10e and 10f.

As described above, according to the third embodiment, the first and second laser beams L1 and L2 having different polarization directions are set parallel to each other and incident on the substrate W. The first and second laser beams L1 and L2 mirror-reflected from the substrate W are respectively detected by the first and second detection devices 10e and 10f without being mixed. The travel directions of the laser beams L1 and L2 do not need to be exactly parallel to each other but needs to be substantially parallel. Accordingly, the situations in the conventional CCD two-point measurement method where the incident points in the element surface of the CCD coincide with each other do not occur. Even if the two laser beams L1 and 12 overlap each other, therefore, the laser beams L1 and L2 are separated by the polarization nature to be detected by the two position detection devices 10e and 10f, respectively. Accordingly, the unmeasurable situations that can occur in the conventional CCD two-point measurement method do not occur, and the reduction of the S/N ratio can be prevented even when the substrate W warps largely or the distance between the laser beams L1 and L2 is shortened. It is therefore possible to prevent the curvature from becoming unmeasurable and increase the accuracy of the curvature measurement.

Moreover, after a laser beam is separated, even when the first and second laser beams L1 and L2 are reflected by the optical system including the polarization beam splitter 10i and mirror 23, the light intensities are little reduced, so that the loss in light intensity can be reduced. In addition, by employing the measurement by normal incidence and reflection, the window of the chamber 2 through which the respective laser beams L1 and L2 pass can be reduced in size. It is therefore possible to prevent the detection position accuracy from being reduced by inclination of the window due to heat or the like.

(Other Embodiment)

Figure 10:
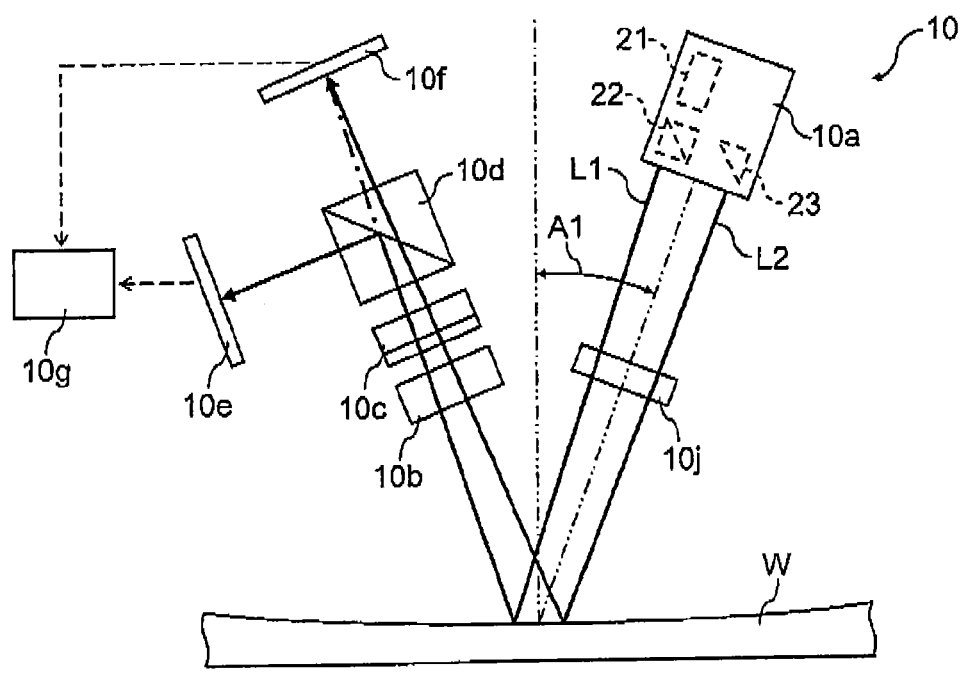
FIG. 10 is a front view illustrating a modification 2 of the curvature measurement apparatus according to the first embodiment.

In the aforementioned first to third embodiments, each laser beam L1 and L2 is not shaped into a sheet, but is not limited to the above case. Each of the laser beams L1 and L2 may be shaped into a sheet. As illustrated in FIG. 10, for example, using a shaping portion 10j composed of a half-cylindrical lens, a unidirectional diffusion filter, or the like, the laser beams L1 and L2 may be expanded in the directions (in the short-side directions) perpendicular to the element array directions (in the longitudinal directions) of the respective one-dimensional position detection devices 10e and 10f to be shaped into sheets extended in the short-side directions thereof. The shaping portion 10j is provided between the projection portion 10a and the substrate W on the optical paths. Accordingly, the laser beams L1 and L2 can surely enter the condenser lens 10c even when the laser beams L1 and L2 deviate in the short-side direction of the one-dimensional position detection devices 10e and 10f because of periodic vibration (vibration of the substrate W due to the rotation thereof). Even in the absence of the condenser lens 10c, the laser beams L1 and L2 can surely enter the one-dimensional position detection devices 10e and 10f, respectively. Since each laser beam L1 and L2 is focused by the condenser lens 10c and surely enters the one-dimensional position detection device 10e or 10f, it is possible to prevent the position detection accuracy from being reduced by periodic vibration. When the substrate W is subject to periodic vibration, the laser beams L1 and L2 do not only deviate in the short-side direction of the position detection devices 10e and 10f, respectively, but also deviate in a circular manner because of the rotation of the substrate W as the measurement object. Even in this case, the laser beams L1 and L2 surely enter the condenser lens 10c since each of the laser beams L1 and L2 is shaped in a sheet extending in the short-side direction as described above.

In the first to third embodiments described above, the first and second laser beams L1 and L2 traveling side by side or in parallel are produced by using the laser beam emitting portion 21, polarization beam splitter 22, mirror 23, and the like as the projection portion 10a but are not limited to this case. The first and second laser beams L1 and L2 traveling side by side or in parallel can be produced by using two laser beam emitting portions. While the intensities of the laser beams L1 and L2 tend to be reduced by the passage through the window of the chamber 2 and the like, the intensities thereof can be increased by using two laser light emitting portions compared with the case of using one laser beam emitting portion. In this case, the polarization beam splitter 22 on the incidence side can be eliminated, but it is desirable to provide a polarization plate for improving the polarization nature, a mirror to bring much closer to each other, the two laser beams which are not close because of the body size of the laser light emitting portions, a system to cool the laser beam emitting portion bodies. Furthermore, since the space for installation of the curvature measurement apparatus 10 (upper part of the film deposition apparatus 1) is small, the casing of the curvature measurement apparatus 10 is preferably small. Accordingly, the curvature measurement apparatus 10 can be configured so that light is introduced from an external light source through a fiber or the like in order to prevent the number of parts from increasing as described above.

In the first to third embodiments described above, the curvature measurement apparatus 10 is used to measure the warpage of the substrate W, but the usage thereof is not limited to this. The curvature measurement apparatus 10 can measure, in addition to warpage, the inclination and height position of the substrate W, for example, by applying the measured curvature.

In the first to third embodiments described above, the shower plate 4 and curvature measurement apparatus 10 are not cooled. However, the present invention is not limited to this. For example, the shower plate 4, curvature measurement apparatus 10, and the like may be cooled by a cooling device which is configured to cool the shower plate 4, curvature measurement apparatus 10, and the like.

In the embodiments described above, one of the laser beams reflected from the measurement object is reflected by the second polarization beam splitter within a plane including the optical paths of the two laser beams incident on the measurement object (in a direction along the drawing surfaces of FIGS. 2, 3 and 7 to 10). On the other hand, this reflection direction may be changed to a direction perpendicular to the above plane (in a direction perpendicular to the drawing surfaces of FIGS. 2, 3 and 7 to 10). This can be achieved in such a simple way that the second polarization beam splitter is turned at 90 degrees about the optical path of the incident laser beam. This modification increases the degree of freedom in shape of the curvature measurement apparatuses of the embodiments and makes it easier to install the apparatus within a limited space.

Figure 11:
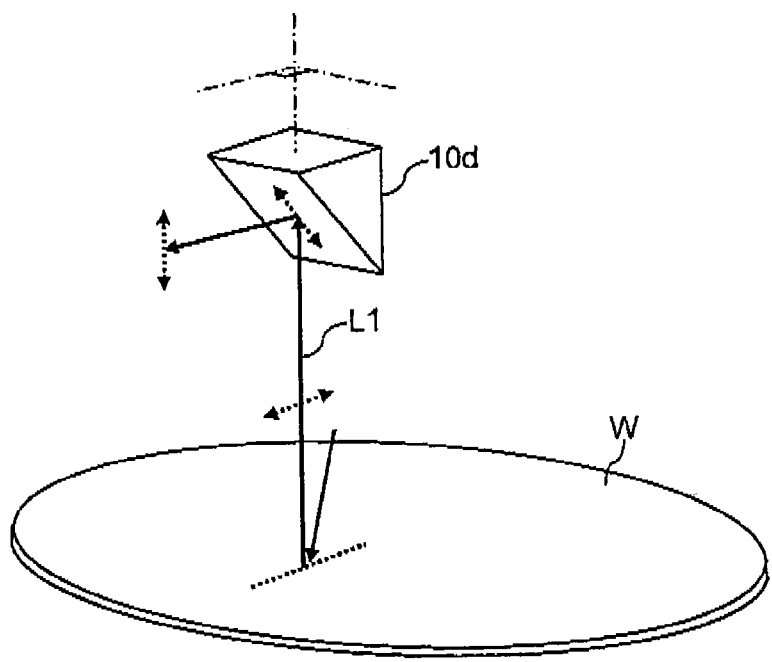
FIG. 11 is a perspective view illustrating the curvature measurement apparatus in FIG. 3.
Figure 12:
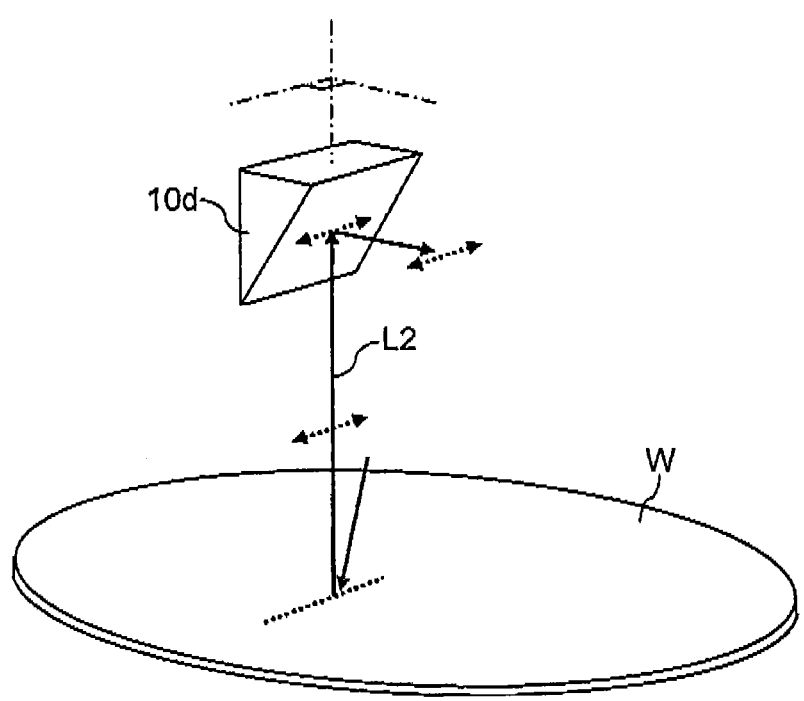
FIG. 12 is a perspective view illustrating a modification of the curvature measurement apparatus in FIG. 3.

In the case where the reflection direction is changed as described above, the second polarization beam splitter is turned at 90 degrees, and accordingly the polarization is revered. It should be noted that an originally-set s- or p-polarized laser beam is treated as a p- or s-polarized laser beam by the polarization beam splitter turned as described above. Moreover, in the case where the reflection direction is changed as described above, a displacement of the laser beam, reflected by the second polarization beam splitter, on the position detection device due to a curvature change of the measurement object is turned at 90 degrees as well. Specifically, by taking the case in FIG. 3 as an example, effects obtained by turning the second polarization beam splitter at 90 degrees are illustrated in FIGS. 11 and 12. FIG. 11 takes out the joint surface of the second polarization beam splitter 10d, and illustrates a relationship among the joint surface, an incident laser beam and a laser beam reflected by the second polarization beam splitter 10d in the case of FIG. 3. As illustrated in FIG. 11, the displacement of the laser beam reflected by the second polarization beam splitter lad with a change in warpage of the substrate W occurs in a substantially vertical direction. This displacement is in a substantially top-and-bottom direction of the drawing surface of FIG. 3. On the other hand, FIG. 12 illustrates a case where the second polarization beam splitter 10d is turned at 90 degrees. As illustrated in FIG. 12, the laser beam reflected by the second polarization beam splitter lad is reflected in a direction perpendicular to the drawing surface of FIG. 3. The displacement of the laser beam reflected by the second polarization beam splitter 10d with a change in warpage of the substrate W occurs in a substantially horizontal direction. It should be noted that this displacement is in a sustainably right-and-left direction of the drawing surface of FIG. 3.

Moreover, by taking the case in FIG. 9 as an example, description is provided for a case where the second polarization beam splitter 10i is turned about the optical path of the second laser beam L2 at 90 degrees. In this case, if a p-polarized light transmission type of polarization beam splitter is used as the second polarization beam splitter 10i, the same function as the configuration in FIG. 9 can be obtained. However, the reflection direction of the second laser beam L2 is a direction perpendicular to the drawing surface of FIG. 9.

As an application example of the present invention, film formation by MOCVD is described in the foregoing embodiments. However, the present invention is applicable to not only MOCVD but also processes such as sputtering and vapor deposition in which the warpage of substrates can change with film deposition. Moreover, it is obvious that the present invention is also applicable to general warpage measurement not limited to deposition. In addition, a single-wafer processing apparatus is described as a major non-limiting application example in the foregoing embodiments. Instead, the present invention may be applied to a batch processing apparatus (simultaneous processing on multiple wafers), for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A curvature measurement apparatus, comprising:
    a light emitter configured to emit a laser beam;
    a first polarization beam splitter configured to separate the laser beam emitted from the light emitter into a first laser beam and a second laser beam which are in different polarization directions and in different travel directions;
    a reflector configured to reflect any one of the first and second laser beams so that the first and second laser beams travel side by side to a measurement object;
    a second polarization beam splitter configured to transmit any one of the first and second laser beams mirror-reflected from the measurement object, and to reflect the other laser beam in a direction different from a travel direction of the one laser beam;
    a one-dimensional first position detector configured to detect an incident position where the first laser beam reflected from or transmitted through the second polarization beam splitter is incident on the first position detector;
    a one-dimensional second position detector configured to detect an incident position where the second laser beam transmitted through or reflected from the second polarization beam splitter is incident on the second position detector; and
    a calculator configured to calculate a difference between a displacement of the incident position of the first laser beam detected by the first position detector and a displacement of the incident position of the second laser beam detected by the second position detector, and calculate a curvature change of the measurement object based on a correlation between the calculated difference and the optical path lengths of the first and second laser beams.

2. The curvature measurement apparatus according to claim 1, wherein the first position detector and the second position detectors detect a change in a shortest distance between two line segments of the first and second laser beams reflected from the measurement object.

3. The curvature measurement apparatus according to claim 1, further comprising a condenser lens configured to focus the first laser beam onto the first position detector in a direction perpendicular to an element array direction of the first position detector, and to focus the second laser beam onto the second position detector in a direction perpendicular to an element array direction of the second position detector.

4. The curvature measurement apparatus according to claim 1, wherein the laser beam emitted by the light emitter emits is a laser beam with a wavelength of 700 nm or less.

5. The curvature measurement apparatus according to claim 1, wherein
    the first position detector includes a first light receiving surface on which the first laser beam is incident,
    a normal direction to the first light receiving surface is inclined at least at 10 degrees with respect to the optical axis of the first laser beam,
    the second position detector includes a second light receiving surface on which the second laser beam is incident, and
    a normal direction to the second light receiving surface is inclined at least at 10 degrees with respect to the optical axis of the second laser beam.

6. The curvature measurement apparatus according to claim 1, further comprising a shaping portion configured to expand the first laser beam in a direction perpendicular to an element array direction of the first position detector, and to expand the second laser beam in a direction perpendicular to an element array direction of the second position detector.

7. A curvature measurement apparatus, comprising:
    a light emitter configured to emit a laser beam;
    a first polarization beam splitter configured to separate the laser beam emitted from the light emitter into a first laser beam and a second laser beam which are in different polarization directions and in different travel directions;
    a reflector configured to reflect the second laser beam so that the first and second laser beams travel side by side to a measurement object;
    a second polarization beam splitter configured to transmit any one of the first and second laser beams traveling toward the measurement object;
    a quarter-wave plate through which the first and second laser beams traveling toward the measurement object pass, and through which the first and second laser beams mirror-reflected from the measurement object pass;

a first position detector configured to detect an incident position where the first laser beam mirror-reflected from the measurement object and coming through the quarter-wave plate is incident on the first position detector;

a second position detector configured to detect an incident position where the second laser beam mirror-reflected from the measurement object and coming through the quarter-wave plate is incident on the second position detector; and a calculator configured to calculate a difference between a displacement of the incident position of the first laser beam detected by the first position detector and a displacement of the incident position of the second laser beam detected by the second position detector, and calculate a curvature change of the measurement object based on a correlation between the calculated difference and the optical path lengths of the first and second laser beams.

8. The curvature measurement apparatus according to claim 7, wherein in a case where the first laser beam traveling toward the measurement object is transmitted through the second polarization beam splitter,
the second polarization beam splitter reflects the first laser beam mirror-reflected from the measurement object and coming through the quarter-wave plate,
the reflector reflects the second laser beam mirror-reflected from the measurement object and coming through the quarter-wave plate,
the first position detector detects the incident position where the first laser beam reflected from the second polarization beam splitter is incident on the first position detector, and
the second position detector detects the incident position where the second laser beam reflected from the reflector is incident on the second position detector.

9. The curvature measurement apparatus according to claim 7, wherein in a case where the second laser beam traveling toward the measurement object is transmitted through the second polarization beam splitter,
the first polarization beam splitter reflects the first laser beam mirror-reflected from the measurement object and coming through the quarter-wave plate,
the second polarization beam splitter reflects the second laser beam mirror-reflected from the measurement object and coming through the quarter-wave plate,
the first position detection device detects the incident position where the first laser beam reflected from the first polarization beam splitter is incident on the first position detector device, and
the second position detector detects the incident position where the second laser beam reflected from the second polarization beam splitter is incident on the second position detector.

10. The curvature measurement apparatus according to claim 7, wherein the first position detector and the second position detector detect a change in a shortest distance between two line segments of the first and second laser beams reflected from the measurement object.

11. The curvature measurement apparatus according to claim 7, further comprising a condenser lens configured to focus the first laser beam onto the first position detector in a direction perpendicular to an element array direction of the first position detector, and to focus the second laser beam onto the second position detector in a direction perpendicular to an element array direction of the second position detector.

12. The curvature measurement apparatus according to claim 7, wherein the laser beam emitted by the light emitter emits is a laser beam with a wavelength of 700 nm or less.

13. The curvature measurement apparatus according to claim 7, wherein the first position detector includes a first light receiving surface on which the first laser beam is incident,
a normal direction to the first light receiving surface is inclined at least at 10 degrees with respect to the optical axis of the first laser beam,
the second position detector includes a second light receiving surface on which the second laser beam is incident, and
a normal direction to the second light receiving surface is inclined at least at 10 degrees with respect to the optical axis of the second laser beam.

14. The curvature measurement apparatus according to claim 7, further comprising a shaping portion configured to expand the first laser beam in a direction perpendicular to an element array direction of the first position detector, and to expand the second laser beam in a direction perpendicular to an element array direction of the second position detector.

15. A curvature measurement method, comprising the steps of:

emitting a laser beam by a light emitter;
separating, by a first polarization beam splitter, the laser beam emitted by the light emitter into a first laser beam and a second laser beam which are in different polarization directions and in different travel directions;
reflecting any one of the first and second laser beams by a reflector so that the first and second laser beams travel side by side to a measurement object;
transmitting, through a second polarization beam splitter, any one of the first laser beam and the second laser beam mirror-reflected from the measurement object, and reflecting the other laser beam by the second polarization beam splitter in a direction different from a travel direction of the one laser beam;
detecting, by a one-dimensional first position detector, an incident position where the first laser beam reflected from or transmitted through the second polarization beam splitter is incident on the first position detector;
detecting, by a one-dimensional second position detector, an incident position where the second laser beam transmitted through or reflected from the second polarization beam splitter is incident on the second position detector; and
calculating a difference between a displacement of the incident position of the first laser beam detected by the first position detector and a displacement of the incident position of the second laser beam detected by the second position detector, and calculating a curvature change of the measurement object based on a correlation between the calculated difference and the optical path lengths of the first and second laser beams.

16. A curvature measurement method, comprising the steps of:

emitting a laser beam by a light emitter;
separating, by a first polarization beam splitter, the laser beam emitted from the light emitter into a first laser beam and a second laser beam which are in different polarization directions and in different travel directions;

reflecting the second laser beam by a reflector so that the first and second laser beams travel side by side to a measurement object;

transmitting, through a second polarization beam splitter, any one of the first and second laser beams traveling toward the measurement object;

causing the first and second laser beams traveling toward the measurement object to pass through a quarter-wave plate, and causing the first and second laser beams mirror-reflected from the measurement object to pass through the quarter-wave plate;

causing a first position detector to detect an incident position where the first laser beam mirror-reflected from the measurement object and coming through the quarter-wave plate is incident on the first position detector; and causing a second position detector to detect an incident position where the second laser beam mirror-reflected from the measurement object and coming through the quarter-wave plate is incident on the second position detector; and calculating a difference between a displacement of the incident position of the first laser beam detected by the first position detector and a displacement of the incident position of the second laser beam detected by the second position detector, and calculating a curvature change of the measurement object based on a correlation between the calculated difference and the optical path lengths of the first and second laser beams.

17. The curvature measurement method according to claim 16, wherein in a case where the first laser beam traveling toward the measurement object is transmitted through the second polarization beam splitter, the first laser beam mirror-reflected from the measurement object and coming through the quarter-wave plate is reflected by the second polarization beam splitter and is detected by the first position detector, and the second laser beam mirror-reflected from the measurement object and coming through the quarter-wave plate is reflected by the reflector, and is detected by the second position detector.

18. The curvature measurement method according to claim 16, wherein in a case where the first laser beam traveling toward the measurement object is transmitted through the second polarization beam splitter, the first laser beam mirror-reflected from the measurement object and coming through the quarter-wave plate is reflected by the first polarization beam splitter and is detected by the first position detector, and the second laser beam mirror-reflected from the measurement object and coming through the quarter-wave plate is reflected by the second polarization beam splitter, and is detected by the second position detector.

* * * * *